(12) United States Patent
Tuominen et al.

(10) Patent No.: US 11,051,391 B2
(45) Date of Patent: Jun. 29, 2021

(54) THERMALLY HIGHLY CONDUCTIVE COATING ON BASE STRUCTURE ACCOMMODATING A COMPONENT

(71) Applicant: AT&S (China) Co. Ltd., Shanghai (CN)

(72) Inventors: Mikael Tuominen, Pernio (FI); Annie Tay, Singapore (SG); Artan Baftiri, Trento (IT)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 15/879,615

(22) Filed: Jan. 25, 2018

(65) Prior Publication Data
US 2018/0213634 A1    Jul. 26, 2018

(30) Foreign Application Priority Data
Jan. 25, 2017 (CN) .......................... 2017-10061261.8

(51) Int. Cl.
*H05K 1/02* (2006.01)
*H01L 23/00* (2006.01)
(Continued)

(52) U.S. Cl.
CPC ........... *H05K 1/0201* (2013.01); *H01L 21/56* (2013.01); *H01L 23/373* (2013.01);
(Continued)

(58) Field of Classification Search
CPC . H01L 23/373; H01L 24/20; H01L 2924/013; H01L 2224/45147; H01L 2924/181; H01L 2924/14; H01L 23/49822; H01L 23/5389; H01L 21/4857; H01L 21/486; H01L 23/3107; H01L 23/3121; H01L 23/3737; H01L 51/5234; H01L 51/5253; H01L 23/49883; H01L 23/5383; H05K 1/0201; H05K 7/20; H05K 3/284;
(Continued)

(56) References Cited

U.S. PATENT DOCUMENTS

| 5,532,512 A | * | 7/1996 | Fillion | ................. H01L 25/071 257/686 |
| 5,695,847 A | * | 12/1997 | Browne | ................. B29C 70/88 428/112 |

(Continued)

FOREIGN PATENT DOCUMENTS

| CN | 100556247 C | 10/2009 |
| CN | 104969668 A | 10/2015 |

(Continued)

OTHER PUBLICATIONS

The Chinese National Intellectual Property Administration of the Peoples Republic of China; Office Action in patent application No. 2017100612618, dated May 17, 2019, pp. 1-9.
(Continued)

*Primary Examiner* — Mandeep S Buttar
(74) *Attorney, Agent, or Firm* — Robert A. Blaha; Smith Tempel Blaha LLC (57) ABSTRACT

A component carrier has a base structure with a recess, a thermally highly conductive coating covering at least a part of a surface of the base structure, and a component in the recess.

19 Claims, 5 Drawing Sheets

(51) Int. Cl.
*H01L 23/373* (2006.01)
*H05K 7/20* (2006.01)
*H01L 23/538* (2006.01)
*H01L 21/56* (2006.01)
*H01L 23/31* (2006.01)

(52) U.S. Cl.
CPC ...... *H01L 23/3737* (2013.01); *H01L 23/5389* (2013.01); *H01L 24/20* (2013.01); *H05K 7/20* (2013.01); *H01L 23/3121* (2013.01); *H01L 2224/04105* (2013.01); *H01L 2224/18* (2013.01); *H01L 2224/2518* (2013.01); *H01L 2224/92144* (2013.01)

(58) Field of Classification Search
CPC ........ H05K 1/181; H05K 1/112; H05K 1/185; H05K 1/0206; H05K 1/113; H05K 2201/0715; H05K 2201/09872; H05K 1/0203; H05K 1/0298; H05K 1/09; H05K 2203/1311; H05K 3/28
USPC ........................................................ 361/720
See application file for complete search history.

(56) References Cited

U.S. PATENT DOCUMENTS

| | | | | |
|---|---|---|---|---|
| 6,074,803 A * | 6/2000 | McGrath | ................ | H05K 3/386 156/273.5 |
| 6,350,953 B1 * | 2/2002 | Franzen | ................ | H01L 23/13 174/528 |
| 9,113,575 B2 * | 8/2015 | Shimizu | ................ | H05K 1/188 |
| 9,832,878 B2 * | 11/2017 | Shimizu | ................ | H05K 1/185 |
| 2003/0227751 A1 * | 12/2003 | Wang | ................ | H01L 25/0652 361/719 |
| 2007/0006456 A1 * | 1/2007 | Kim | ................ | H05K 1/185 29/852 |
| 2007/0290366 A1 * | 12/2007 | Cheng | ................ | H01L 23/5389 257/778 |
| 2008/0052906 A1 * | 3/2008 | Lee | ................ | H01L 21/50 29/847 |
| 2008/0094805 A1 * | 4/2008 | Tuominen | ................ | H01L 23/5389 361/728 |
| 2008/0315398 A1 | 12/2008 | Lo et al. | | |
| 2009/0296349 A1 * | 12/2009 | Suzuki | ................ | H05K 1/0206 361/705 |
| 2010/0065317 A1 * | 3/2010 | Okada | ................ | H05K 1/036 174/258 |
| 2010/0108370 A1 * | 5/2010 | Kapusta | ................ | H05K 1/181 174/260 |
| 2010/0123239 A1 * | 5/2010 | Kunimoto | ................ | H01L 23/5389 257/690 |
| 2010/0224397 A1 * | 9/2010 | Shimizu | ................ | H01L 23/5384 174/260 |
| 2010/0226098 A1 * | 9/2010 | Loibl | ................ | F16H 61/0006 361/721 |
| 2011/0085316 A1 * | 4/2011 | Myers | ................ | H05K 9/0024 361/818 |
| 2012/0241205 A1 * | 9/2012 | Shimizu | ................ | H05K 1/188 174/260 |
| 2013/0284506 A1 * | 10/2013 | Zanma | ................ | H05K 1/115 174/260 |
| 2014/0036461 A1 * | 2/2014 | Palaniswamy | ........ | H01L 33/486 361/762 |
| 2014/0144686 A1 * | 5/2014 | Shimizu | ................ | H05K 1/185 174/258 |
| 2014/0209360 A1 * | 7/2014 | Peng | ................ | H05K 1/028 174/254 |
| 2015/0043183 A1 * | 2/2015 | Ishiguro | ................ | H05K 1/185 361/761 |
| 2015/0257308 A1 * | 9/2015 | Li | ................ | H05K 7/20427 361/706 |
| 2015/0366051 A1 * | 12/2015 | Fischeneder | ........ | H05K 1/0218 174/251 |
| 2016/0021763 A1 * | 1/2016 | Stahr | ................ | H05K 3/323 361/761 |
| 2016/0324004 A1 * | 11/2016 | Schwarz | ................ | H01L 24/82 |
| 2016/0366757 A1 * | 12/2016 | Kobayashi | ............ | H05K 1/181 |
| 2016/0381792 A1 * | 12/2016 | Mok | ................ | H05K 1/0271 174/251 |
| 2017/0033083 A1 * | 2/2017 | Lin | ................ | H01L 23/49838 |
| 2017/0034923 A1 * | 2/2017 | Lin | ................ | H05K 3/4038 |
| 2018/0042761 A1 * | 2/2018 | Smith | ................ | A61F 7/007 |
| 2018/0092220 A1 * | 3/2018 | Wiedenhofer | ....... | H05K 1/0306 |

FOREIGN PATENT DOCUMENTS

| | | |
|---|---|---|
| CN | 106304634 A | 1/2017 |
| JP | 2002050724 A | 2/2002 |
| JP | 2012146828 A | 8/2012 |
| WO | WO 2015/135734 A1 | 9/2015 |
| WO | WO 2015/138110 A1 | 9/2015 |

OTHER PUBLICATIONS

The Chinese National Intellectual Property Administration of the Peoples Republic of China; Office Action in patent application No. 201710061261.8, dated Nov. 22, 2019, pp. 1-11.
Notification of Third Office Action in Application No. 201710061261.8; dated Apr. 1, 2020; pp. 1-11 ; The China National Intellectual Property Administration, Shanghai, China.

* cited by examiner

THERMALLY HIGHLY CONDUCTIVE COATING ON BASE STRUCTURE ACCOMMODATING A COMPONENT

CROSS-REFERENCE TO RELATED APPLICATION

This application claims the benefit of the filing date of the Chinese Patent Application No. 2017-10061261.8 filed 25 Jan. 2017, the disclosure of which is hereby incorporated herein by reference.

TECHNICAL FIELD

The invention relates to a method of manufacturing a component carrier, and to a component carrier.

BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Moreover, embedding a component in a component carrier without the risk of overheating during operation is an issue. This is in particular difficult when components are embedded which generate a considerable amount of heat during operation.

SUMMARY

There may be a need to embed a component in a component carrier without excessive thermal stress during operation.

According to an exemplary embodiment of the invention, a component carrier is provided, wherein the component carrier comprises a base structure having a recess, a thermally highly conductive coating (or lining or film or layer structure) covering at least a part of a surface of the base structure, and a component in the recess.

According to another exemplary embodiment of the invention, a method of manufacturing a component carrier is provided, wherein the method comprises providing a base structure having a recess, covering at least a part of a surface of the base structure with a thermally highly conductive coating, and mounting (in particular before or after the coating) a component in the recess.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "thermally highly conductive coating" may particularly denote a layer-type rather than a bulky structure with a thickness being smaller than the thickness of the entire component carrier. For instance, the thickness of the coating may be less than 50%, in particular smaller than 30%, more particularly smaller than 15% of the thickness of the entire component carrier. The coating may be planar or straight (for instance when deposited on a planar underground) or may be curved or bent (for instance when laminated or deposited on a curved or bent underground or an underground having a surface profile).

According to an exemplary embodiment of the invention, a component carrier with an embedded component (such as a semiconductor chip) and with implemented heat removal capability for efficiently removing heat generated during operation is provided, which may be manufactured with only small modification or small additional effort compared to ordinary component carrier manufacture. Highly advantageously, a base structure having a recess may be directly coated with a highly thermally conductive coating which may therefore be located very close to and hence strongly thermally coupled with the component embedded in the recess. The provision of such a coating does not exclude, but may even explicitly allow, the implementation of additional standard component carrier material (such as ordinary prepreg) in the component carrier. Such standard material may have beneficial properties for the component carrier apart from the heat removal function, such as a proper contribution to mechanical stability and/or flexibility, compliance with other component carrier materials for instance in terms of thermal expansion properties, etc. Such functions may hence be maintained while adding an improved thermal performance of the component carrier. Thus, a small adaptation rather than a complete redesign of the component carrier manufacturing and construction architecture may be sufficient to implement a well-definable and highly efficient heat removal path by implementing the thermally highly conductive coating. By taking this measure, thermal energy generated, for instance as ohmic heat, during operation of the component embedded in an interior of the component carrier may be efficiently dissipated by heat conduction along the thermally highly conductive coating. Due to the close spatial relationship between the highly thermally conductive coating and the heat source in form of the embedded component, this heat removal can be rendered particularly efficient. Also advantageously, a coating of the base structure can be manufactured in a simple way by laminating and/or deposition of corresponding thermally conductive material.

In the following, further exemplary embodiments of the method and the component carrier will be explained.

In an embodiment, multiple components are embedded in the component carrier. Thus, it is possible in all embodiments to implement only one or a plurality of components in a component carrier thermally coupled with the coating.

In an embodiment, the thermally highly conductive coating covers at least a part of a surface of the component. Thereby, the thermal path from the embedded component to the base structure and from there out of the component carrier may be closed or continued, so that an uninterrupted heat removal path may be formed.

In an embodiment, the base structure comprises a core, or a stack comprising at least one electrically conductive layer structure and/or the at least one electrically insulating layer structure. For example, a core may be a relatively thick sheet of fully cured material such as FR4. It is however also possible to embody the base structure as a stack of layer structures of component carrier material such as prepreg, FR4 and/or copper.

In an embodiment, the thermally highly conductive coating has a value of thermal conductivity of at least 1 W/mK (for instance at least 1.5 W/mK), in particular at least 10 W/mK, more particularly at least 50 W/mK. These values may refer to an average value of the material of the thermally highly conductive coating over the various spatial directions, to an isotropic thermal conductivity of the material of the thermally highly conductive coating, or to one direction (in particular a direction perpendicular to a main surface of the component carrier or parallel to a main surface of the component carrier) of the material of the thermally highly conductive coating. Therefore, the thermal conductivity of the highly thermally conductive coating may be better or higher than the thermal conductivity of ordinary dielectric component carrier material such as ordinary prepreg. Such dielectric component carrier material may comprise resin, in particular epoxy resin, in which reinforcing particles such as glass fibres or glass spheres may be embedded. Therefore, the specific configuration of the coating of highly thermally conductive material may significantly improve the heat removal properties of the component carrier.

In an embodiment, the thermally highly conductive coating comprises diamond-like carbon (DLC), graphene, highly thermally conductive prepreg, a resin filled with thermally highly conductive filler particles, copper, and/or aluminum. The material(s) of the thermally highly conductive coating may be electrically insulating and/or electrically conductive. The mentioned materials are compatible with PCB manufacturing processing and are capable of significantly increasing the thermal performance of the component carrier.

In an embodiment, the thermally highly conductive coating extends continuously from the recess (in particular from the component in the recess) up to an exterior (for instance exposed) surface of the component carrier. When the coating extends from the recess, in which the component is embedded, to an exterior surface of the component carrier, a complete, continuous and uninterrupted thermal path may be formed along which heat generated during operation of the component may be removed in a defined way. By taking this measure, the heat may be dissipated particularly efficiently. At the same time, such a continuous path may be simply manufactured by laminating or depositing the highly thermally conductive coating.

In an embodiment, the thermally highly conductive coating is a three-dimensionally curved continuous layer. When applied by deposition, the shape of the coating follows the surface profile of the structure on which the coating is deposited. Therefore, also a complex three-dimensional lining of the surface which forms the basis for the component embedding may be accomplished.

In an embodiment, the thermally highly conductive coating is a layer with a substantially uniform thickness. With such a configuration of a layer of homogeneous thickness, the coating may provide spatially uniform or equal properties. Therefore, the formation of hot spots in an interior of the component carrier may be prevented, where heat is not properly removed.

In an embodiment, the thermally highly conductive coating covers at least a part of the surface of the base structure, at least a part of the surface of the component and at least part of a gap in the recess between the base structure and the component. In such a configuration, the coating provides a continuous thermal path from the component, which is also directly contacted by the coating, up to an exterior surface of the component carrier. This results in a high thermal performance of the manufactured component carrier.

In an embodiment, the thermally highly conductive coating covers at least part of both opposing main surfaces of the base structure and/or at least part of both opposing main surfaces of the component. By taking this measure, a major portion of the surface of the component may be directly thermally coupled with a material having a high thermal conductivity. This efficiently removes heat from the component during operation of the component carrier.

In an embodiment, at least part of the thermally highly conductive coating covers a side wall of the recess of the base structure. By not only covering upper and lower main surfaces, but additionally or alternatively also side walls of the base structure, also the lateral wall of the embedded component may be directly thermally contacted by the coating, which provides an additional heat removal path.

In an embodiment, a gap may remain between the thermally highly conductive coating on the side wall and the component. However, such a gap may be rendered very small and may be filled, if desired, with additional highly thermally conductive material so as to further promote the heat removal properties of the component carrier.

In an embodiment, dielectric material of the base structure has a value of thermal conductivity of less than that of the highly thermally conductive coating. Thus, the dielectric material of the base structure may be selected as sufficiently stiff and preferably already fully cured at the time of mounting the component in the recess, even if it has a relatively poor thermal conductivity. The reason for this freedom of selection is that the high thermal conductivity of the coating alone may be already sufficient for proper heat dissipation. Thus, design freedom may be combined with high thermal performance and high mechanical robustness.

In an embodiment, dielectric material of the base structure has a value of thermal conductivity of less than 1 W/mK, in particular less than 0.5 W/mK (wherein the given values may in particular refer to a direction perpendicular to a main surface of the component carrier). In particular, the dielectric material of the base structure may be FR4 (i.e. cured epoxy resin with reinforcing glass fibers) having a thermal conductivity in a direction perpendicular to a main surface of the component carrier, i.e. through plane, of about 0.4 W/mK.

In an embodiment, the surface of the base structure is covered with the thermally highly conductive coating by dispensing, ink jetting, screen printing, stencil printing, laminating, printing, chemical vapor deposition (CVD), and/or physical vapor deposition (PVD). Therefore, there are various manufacturing methods available which can be freely used for applying the coating. This provides a component carrier designer with a high degree of freedom of adjusting the manufacturing process and the properties of the coating to a specific need of a certain application.

In an embodiment, the surface of the base structure is covered with the thermally highly conductive coating by laminating a thermally highly conductive layer structure on the base structure and the component. When embodied as a lamination structure, the highly thermally conductive coating may be applied to the base structure during an ordinary lamination procedure of forming the component carrier. In the context of the present application, the term "laminating" may denote the application of mechanical pressure, if desired accompanied by heat. By integrating the lamination of the thermally highly conductive layer structure for the formation of the coating into the manufacturing procedure of the component carrier, the coating may be formed substantially without additional manufacturing effort.

In an embodiment, a first main surface of the base structure is covered with the thermally highly conductive coating by laminating a first thermally highly conductive layer structure on the first main surface, and a second main surface of the base structure is covered with the thermally highly conductive coating by (for instance simultaneously or subsequently) laminating a second thermally highly conductive layer structure on the second main surface. A lamination of two highly thermally conductive layer structures on two opposing main surfaces of the base structure and/or of the component further simplifies the provision of even high performance coatings and nevertheless keeps the manufacturing process simple.

In an embodiment, the surface of the base structure is covered with the thermally highly conductive coating by depositing a layer of thermally highly conductive material. The deposited layer may be a conformal layer. Corresponding conformal coating material may be a thin film which conforms to the contours of the component carrier under manufacture (for instance a printed circuit board) to continuously cover and uninterruptedly thermally couple the component carrier's constituents. Deposition procedures may be easily implemented in the framework of a component carrier manufacturing procedure and therefore allow to manufacture the component carrier with low effort.

In an embodiment, the layer of thermally highly conductive material is a planar layer deposited on a main surface of the base structure and on a main surface of the component being in flush with one another. By taking this measure, a very short linear thermal dissipation path may be defined.

In another embodiment, the layer of thermally highly conductive material is a curved layer deposited on a main surface of the base structure and on a main surface of the component being retracted with regard to the base structure. By such a curved structure, the shape of the component may correspond to the coating so as to further increase the thermal coupling between component and coating.

In an embodiment, a first part of the surface of the base structure is covered with the thermally highly conductive coating applied by laminating, and a second part of the surface of the base structure is covered with the thermally highly conductive coating applied by deposition. By the combination of a lamination and a deposition procedure concerning different sections or parts of the highly thermally conductive coating, a very high heat removal capability may be obtained.

In an embodiment, the entire surface of the base structure and/or the entire surface of the component is/are covered with the thermally highly conductive coating. This arrangement further promotes the heat removal without significantly increasing the dimension, weight and cost of the component carrier.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier and/or may be embedded in an interior thereof. Moreover, also other than the mentioned components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the base structure and/or at least one further electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, electrically conductive material of the base structure and/or at least one further electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

The illustrations in the drawings are presented schematically. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a direct heat dissipation in the context of embedding a component in a component carrier is enabled. One gist according to an exemplary embodiment is to allow heat dissipation from the region in which the component is located in the component carrier. By taking this measure, it is possible to reduce a thermal cycling range or an operating temperature in the area surrounding the embedded component(s) as well as on the component(s) itself/themselves which is or are affected by high heat dissipation. According to exemplary embodiments, component carrier designs are provided allowing improvement in the heat flow and dissipation from the area where components are embedded. Several materials can be advantageously implemented for this purpose, such as DLC (diamond-like carbon), graphene, prepreg (i.e. resin with reinforcing particles) with high thermal conductivity, dispensed, ink-jetted, screen printed and/or stencil printed material with high thermal conductivity. With such embodiments, a heat dissipation function may be provided being connected to embedding applications.

Thereby, reliability of component carriers manufactured in embedding technology may be improved. Particularly, high thermal conductivity prepreg, DLC and/or graphene may be used for heat dissipation in the framework of embedding one or more components. Heat dissipation layers may be implemented in embedding technology.

FIG. 1 to FIG. 4 illustrate cross-sectional views of structures obtained during performance of a method of manufacturing a component carrier 100 with an embedded component 108 according to an exemplary embodiment of the invention.

Figure 1:
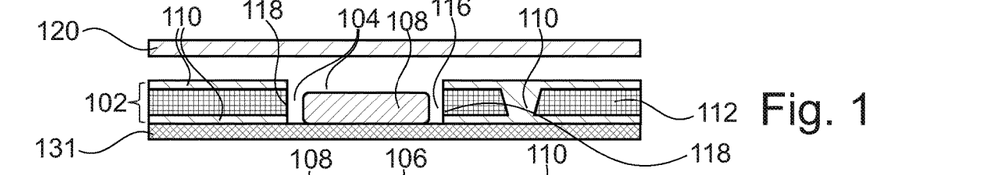
FIG. 1, FIG. 2, FIG. 3 and FIG. 4 illustrate cross-sectional views of structures obtained during carrying out a method of manufacturing a component carrier with an embedded component according to an exemplary embodiment of the invention.

Referring to FIG. 1, a multi-layer laminate base structure 102 is provided which has a recess 104 embodied as an opening extending through the entire base structure 102 in a vertical direction. The recess 104 is closed at a bottom side by a temporary carrier 131 which may be embodied as a sticky tape for adhering to the base structure 102 and to component 108. The component 108, which is here embodied as a semiconductor chip, is mounted in the recess 104 with a small gap 116 remaining between a side wall 118 of the base structure 102 and a side wall of the component 108.

The base structure 102 is here embodied as a core which is composed of a thick central electrically insulating layer structure 112 (for instance made of FR4) in a fully cured state. The thick central electrically insulating layer structure 112 is covered on both opposing main surfaces thereof with a respective electrically conductive layer structure 110, here embodied as copper foils. The copper foils are interconnected by a vertical through connection, embodied as a copper via and forming a further electrically conductive layer structure 110.

A thermally highly conductive layer structure 120 is then placed above the described arrangement as a preform of a thermally highly conductive coating 106 to be formed. The thermally highly conductive layer structure 120 may be made of a highly thermally conductive material in an at least partially uncured state. In the context of the present application, the term "at least partially uncured material" may particularly denote material which becomes reflowable (i.e., material that reflows) during a lamination procedure, i.e. by the application of increased temperature and/or pressure. For example, such a material may be a resin which is still non-crosslinked. When the thermally highly conductive layer structure 120 is made of an at least partially uncured material, connection of the thermally highly conductive layer structure 120 with the rest of the arrangement of FIG. 1 may be accomplished in the framework of a lamination procedure in which the material of the thermally highly conductive layer structure 120 temporarily remelts or becomes flowable. Subsequent resolidification of the material of the thermally highly conductive layer structure 120 then results in a fixed embedding of the component 108 with proper heat removal coupling with the material of the thermally highly conductive layer structure 120.

In contrast to this, the base structure 102 may be made of a fully cured material. In this context, the term "fully cured" may particularly denote a material property according to which the corresponding material (such as resin) is not capable any more of being re-melted to become flowable and of being subsequently re-solidified. Such resin material may be already crosslinked. Thus, the fully cured material may be a C-stage material rather than an A-stage or B-stage material. By taking this measure it can be ensured that the base structure 102 itself does not lose its supporting function or change its position during the connection procedure (in particular a lamination procedure which may involve increased pressure and/or increased temperature), so that high positional accuracy may be ensured.

Figures 2, 3:
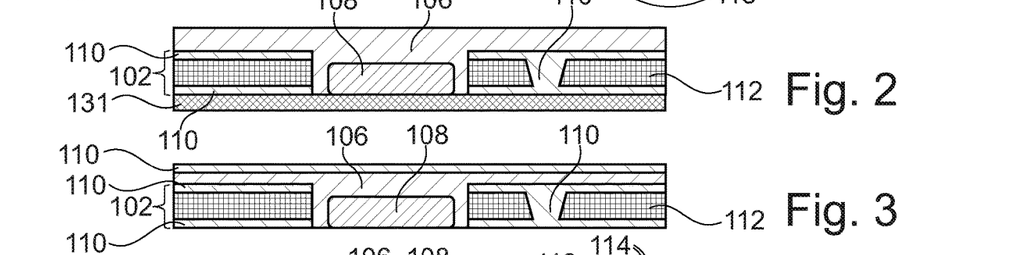

Referring to FIG. 2, the upper surface and a part of the vertical side surface of the base structure 102 as well as the upper surface and a part of the vertical side surface of the component 108 are covered simultaneously with thermally highly conductive coating 106 by laminating the thermally highly conductive layer structure 120 thereon. By the lamination, the structure shown in FIG. 2 becomes rigid. More generally, it is possible to laminate, print, deposit and/or dispense high heat conductivity dielectric material in form of the coating 106 on the embedded core in form of the base structure 102. As can be taken from FIG. 2, the structure of FIG. 1 is laminated, i.e. connected by the application of mechanical pressure, if desired combined with heat. During this lamination procedure, the previously at least partially uncured material of the highly thermally conductive layer structure 120 is re-melted, crosslinked and subsequently re-solidified. Thereby, the thermally highly conductive coating 106 is formed which covers the upper main surface of the base structure 102, a major portion of the surface of the component 108 and an exposed portion of the temporary carrier 131. The highly thermally conductive layer structure 120 may be made of a highly thermally conductive prepreg, i.e. a resin with reinforcing particles and optionally highly thermally conductive filler particles made of a material having an extraordinarily high thermal conductivity of for example at least 1 W/mK or more.

The dielectric material of the base structure 102 has a value of thermal conductivity which is lower than that of the highly thermally conductive coating 106. For instance, the dielectric FR4 material of the base structure 102 may have a value of thermal conductivity of about 0.4 W/mK in a direction perpendicular to a main surface of the component carrier 100, i.e. a vertical direction according to FIG. 2. The dielectric material of the thermally highly conductive coating 106, however, may have a significantly higher value of thermal conductivity, for instance at least 1 W/mK (for example when embodied as highly thermally conductive prepreg) or even higher than 100 W/mK (for instance when embodied as graphene).

Referring to FIG. 3, the temporary carrier 131 may be removed after the lamination, since it is now no longer necessary to support the elements of the shown structure as a result of the lamination. Thus, in order to obtain the structure shown in FIG. 3, the sticky tape constituting the temporary carrier 131 may be peeled off from the lower main surface of the structure shown in FIG. 2. Due to the curing of the previously uncured material of the highly thermally conductive coating 106 during lamination, the structure according to FIG. 3 now has sufficient stability to hold together even without the temporary carrier 131. Moreover, a further electrically conductive layer structure 110 (for instance a further copper foil) may be attached to an upper main surface of the structure shown in FIG. 2.

Figure 4:
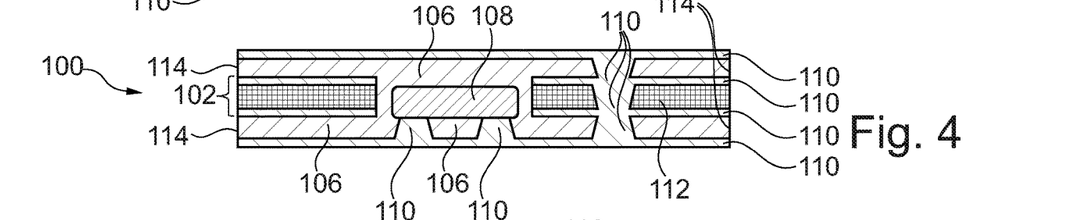

Referring to FIG. 4, a component carrier 100 is shown in which not only the upper main surface of the base structure 102 and of the component 108 are covered with thermally highly conductive coating 106. Additionally, also the lower main surface of the base structure 102 and of the component 108 are now covered with thermally highly conductive coating 106 by laminating a further thermally highly conductive layer structure 120 (not shown) on the lower main surface of the structure shown in FIG. 3. Consequently, substantially the entire surface of the base structure 102 and substantially the entire surface of the component 108 are covered with material of the thermally highly conductive coating 106. Thus, in the configuration according to FIG. 4, substantially the entire surface of the component 108 is directly covered with the thermally highly conductive coating 106 which results in a highly efficient heat removal capability for removing heat during operation of the component carrier 100.

Furthermore, electrical connections to the base structure 102 and the component 108 are formed as vertical interconnect structures such as copper vias (compare further electrically conductive layer structures 110 in FIG. 4). For this purpose, access holes may be drilled (for instance by laser drilling or mechanically drilling) and subsequently filled with electrically conductive material such as galvanic copper. This allows to electrically connect the embedded component 108 to an electronic environment of the component carrier 100 and for establishing electric connections within the component carrier 100.

The component carrier 100 according to the exemplary embodiment of the invention shown in FIG. 4 is embodied as a plate-shaped laminate-type printed circuit board (PCB). Advantageously, the thermally highly conductive coating 106 extends from the central recess 104 up to the lateral exterior surfaces 114 of the component carrier 100. The thermally highly conductive coating 106 covers a major portion of the surface of the base structure 102, a major portion of the surface of the component 108 and fills the gap 116 between the base structure 102 and the component 108. Highly advantageously, the thermally highly conductive coating 106 covers both opposing main surfaces of the base structure 102, and both opposing main surfaces of the component 108. The two-sided highly heat conductive dielectric material in form of coating 106 may be laminated, printed, deposited and/or dispensed on the core-type base structure 102 and the semiconductor component 108.

In the embodiment according to FIG. 1 to FIG. 4, component carrier 100 configured as an embedded package is provided, where a high heat conductivity material (compare coating 106) is laminated, printed, deposited and/or dispensed partially or fully directly on the embedded surface on one or two sides of the component 108. The material to be used can be any type of dielectric material with heat dissipation properties of preferably at least 1 W/mK. The highly thermally conductive prepreg material used for this purpose can be, for example, any epoxy type of resin compound with fillers (such as alumina, conductive carbon fiber, etc.). Also graphene or DLC based materials can be used.

Figures 5, 6:
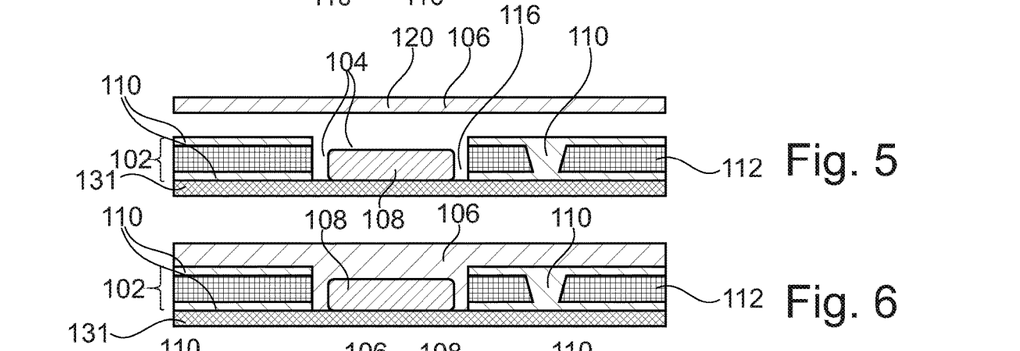
FIG. 5, FIG. 6, FIG. 7 and FIG. 8 illustrate cross-sectional views of structures obtained during carrying out a method of manufacturing a component carrier with an embedded component according to another exemplary embodiment of the invention.
Figure 7:
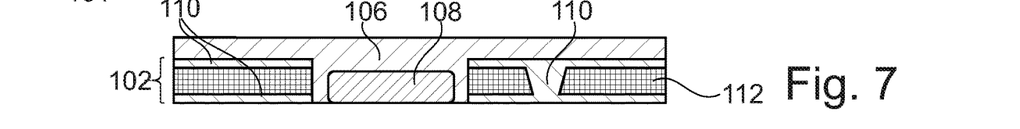
Figure 8:
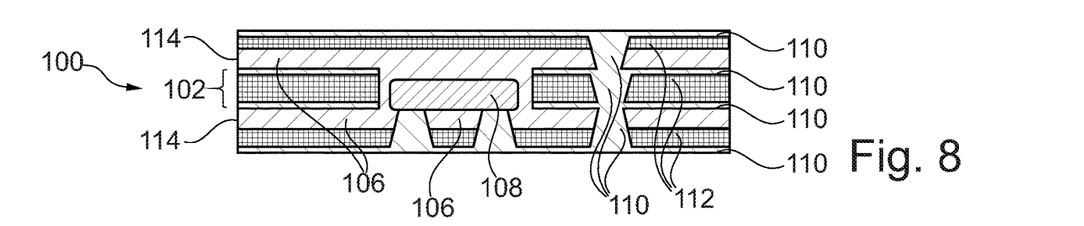

FIG. 5 to FIG. 8 illustrate cross-sectional views of structures obtained during performance of a method of manufacturing a component carrier 100 with an embedded component 108 according to another exemplary embodiment of the invention. FIG. 5 corresponds to FIG. 1, FIG. 6 corresponds to FIG. 2, FIG. 7 substantially corresponds to FIG. 3, and FIG. 8 substantially corresponds to FIG. 4.

The embodiment shown in FIG. 5 to FIG. 8 differs from the embodiment according to FIG. 1 to FIG. 4 in that additional electrically insulating layer structures 112 are sandwiched between the outermost electrically conductive layer structures 110 on the one hand and the portions of the thermally highly conductive coating 106 above and below base structure 102 and component 108, respectively, on the other hand. These additionally interposed electrically insulating layer structures 112 may be made of ordinary prepreg, such as epoxy resin with reinforcing glass fibres, i.e. having a lower value of thermal conductivity than the coating 106. In view of the excellent thermal performance of the thermally highly conductive coating 106, the outer structures need not necessarily be made of this special material and can therefore be provided with less cost and/or may be made of a material specifically selected to achieve other effects than an improvement of the thermal performance (for instance for improving mechanical integrity, electric performance, etc., of the component carrier 100).

In the embodiment according to FIG. 5 to FIG. 8, an embedded package-type component carrier 100 is provided, in which a highly heat conductivity material in form of coating 106 is laminated, printed, deposited and/or dispensed partially or fully directly on the embedded surface on one or two sides of the component 108, wherein the highly thermally conductive dielectric material of coating 106 may be combined with standard prepreg material with an ordinary/lower heat conductivity.

Figure 9:
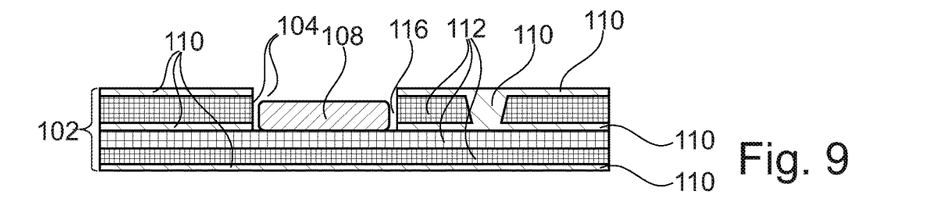
FIG. 9, FIG. 10 and FIG. 11 illustrate cross-sectional views of structures obtained during carrying out a method of manufacturing a component carrier with an embedded component according to still another exemplary embodiment of the invention.
Figures 10, 11:
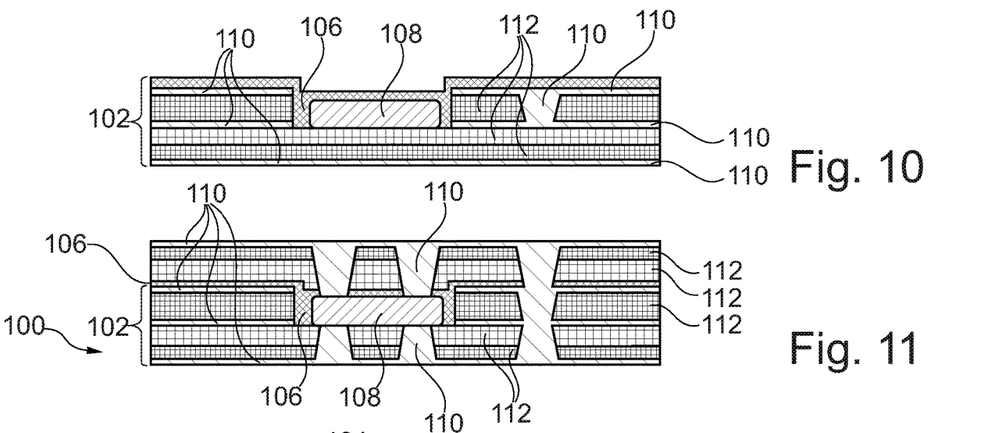

FIG. 9 to FIG. 11 illustrate cross-sectional views of structures obtained during performance of a method of manufacturing a component carrier 100 with an embedded component 108 according to still another exemplary embodiment of the invention.

In order to obtain the structure shown in FIG. 9, a plurality of electrically insulating layer structures 112 and a plurality of electrically conductive layer structures 110 are connected to one another by lamination to thereby form a laminated stack in form of base structure 102. In this stack, a recess 104 is formed, which is here embodied as a blind hole in the component carrier material of base structure 102. Such a blind hole may be formed, for instance, by implementing a non-adhering release layer (for instance made of a waxy component) within the component carrier material and by cutting out a portion of the component carrier material above the release layer (not shown). Component 108 is then mounted in the blind-hole-type recess 104. In the shown embodiment, the two outermost electrically insulating layer structures 112 may be PCB cores, wherein the central electrically insulating layer structure 112 directly beneath the component 108 may be prepreg.

Referring to FIG. 10, the exposed upper surface of the base structure 102 as well as the exposed surface of the component 108 are covered by depositing a film of thermally highly conductive coating 106, for instance made of graphene or diamond-like carbon. For example, deposition may be accomplished by dispensing, ink jetting, screen printing, stencil printing, etc. The so obtained thermally highly conductive coating 106 is here embodied as a thin film, more precisely as a three-dimensionally curved continuous layer-type thin film. Thus, the layer of thermally highly conductive material forming the coating 106 is here embodied as a curved layer deposited on a main surface of the base structure 102 and on a main surface of the component 108 being vertically slightly retracted with regard to the base structure 102. The thermally highly conductive coating 106 formed thereby covers side walls and a top wall of both the component 108 and the base structure 102 to accomplish a proper heat removal during operation.

Referring to FIG. 11, the process of manufacturing the shown component carrier 100 is completed by a further lamination on the top side of the PCB carrier package and by the formation of electrical connections to the base structure 102 and component 108. Hence, it is possible to laminate at least one further electrically insulating layer structure 112 and at least one further electrically conductive layer structure 110 on the upper main surface of the structure shown in FIG. 10. Subsequently, access holes may be drilled (for instance by laser processing or mechanically) and may be filled with electrically conductive material such as copper in order to form vertical interconnects as part of the shown electrically conductive layer structures 110.

In the embodiment according to FIG. 9 to FIG. 11, an embedded package is provided in which a high heat conductivity material is applied partially or fully directly on the embedded surface on one side of the component 108 in a manner that the embedded component carrier 100 is already fully or partially processed by the time of component placement on the PCB carrier.

FIG. 12 to FIG. 15 illustrate cross-sectional views of structures obtained during performance of a method of manufacturing a component carrier 100 with an embedded component 108 according to still another exemplary embodiment of the invention. Although not shown in FIG. 11, it is optionally possible that side walls 118 of the base structure 102 are covered with highly thermally conductive material, such as copper.

Figure 12:
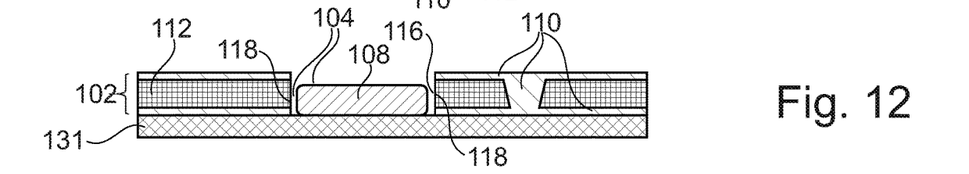
FIG. 12, FIG. 13, FIG. 14 and FIG. 15 illustrate cross-sectional views of structures obtained during carrying out a method of manufacturing a component carrier with an embedded component according to still another exemplary embodiment of the invention.

In order to obtain the structure shown in FIG. 12, procedures described referring to FIG. 1 can be carried out.

Figure 13:
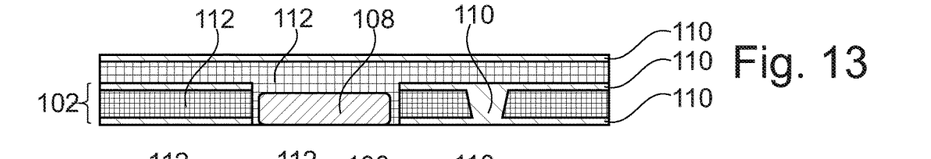

Referring to FIG. 13, one or more electrically insulating layer structures 112 (for instance made of ordinary prepreg) and one or more electrically conductive layer structures 110 (for instance made of copper) may then be laminated on top of the structure shown in FIG. 12. It is for instance possible to laminate, print, deposit and/or dispense the package top layer with standard or low heat conductivity material. Thereafter, the temporary carrier 131 (for instance a sticky tape) may be removed.

Figures 14, 15:
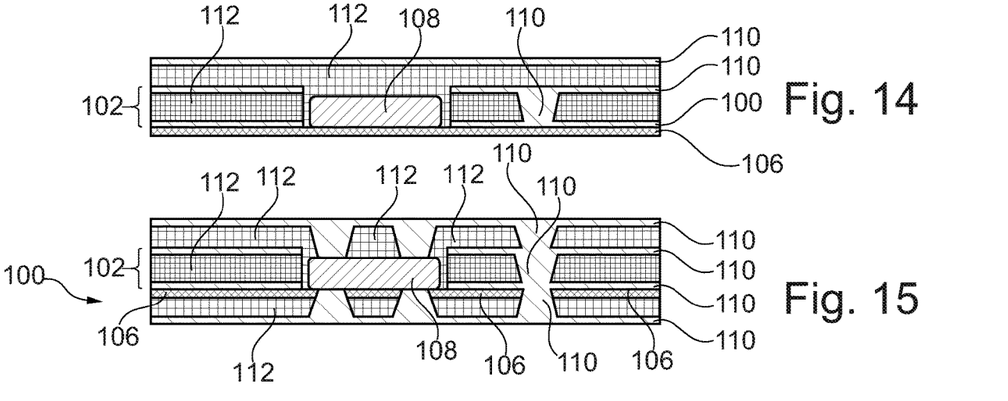

Referring to FIG. 14, a layer of thermally highly conductive material may be formed, which may be embodied as a conformal planar layer deposited on a lower main surface of the base structure 102 and on a lower main surface of the component 108 being in flush with one another. According to FIG. 14, the so formed thermally highly conductive coating 106 may hence be embodied as a layer with a substantially uniform thickness. The material of the thermally highly conductive coating 106 can be any epoxy type of resin compound with thermal conductivity increasing fillers (for example alumina, conductive carbon fiber, etc.). Also graphene or DLC based materials can be used for the thermally highly conductive coating 106. Thus, it is possible to laminate, print, deposit and/or dispense the high heat conductivity layer fully or partially on the bottom side of the package or component carrier 100 under manufacture.

Referring to FIG. 15, formation of the shown component carrier 100 or embedded core package is completed by carrying out a further lamination procedure on a bottom side of FIG. 14 and by forming electrical connections to the base structure 102 and the component 108. Thus, as can be taken from FIG. 15, one or more further electrically insulating layer structures 112 and/or one or more further electrically conductive layer structures 110 may be formed on the lower main surface of the structure shown in FIG. 14. Contact holes may be drilled and filled with electrically conductive material for contacting the embedded component 108, in the shown embodiment from two sides.

In the embodiment according to FIG. 12 to FIG. 15, an embedded package or component carrier 100 is provided, in which a high heat conductivity material is applied partially or fully directly on the bottom surface of the component carrier 100 with embedded component 108.

Figure 16:
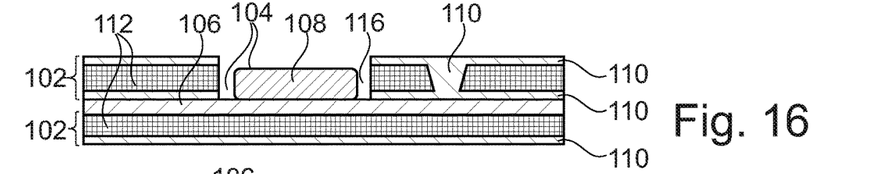
FIG. 16, FIG. 17 and FIG. 18 illustrate cross-sectional views of structures obtained during carrying out a method of manufacturing a component carrier with an embedded component according to still another exemplary embodiment of the invention.
Figures 17, 18:
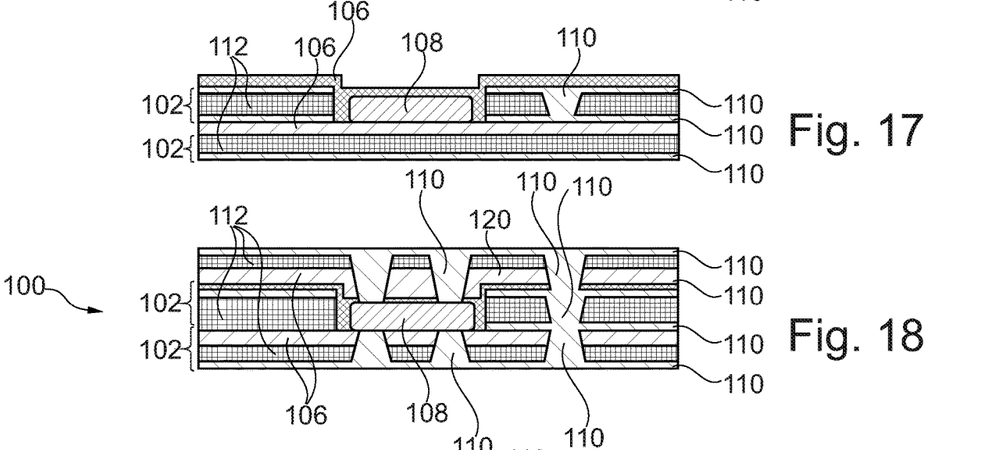

FIG. 16 to FIG. 18 illustrate cross-sectional views of structures obtained during performance of a method of manufacturing a component carrier 100 with an embedded component 108 according to still another exemplary embodiment of the invention.

The structure shown in FIG. 16 is identical to the structure shown in FIG. 9 with the exception that the electrically insulating layer structure 112 directly beneath the component 108 in FIG. 9 is substituted by a high heat dissipation dielectric sheet material in form of thermally highly conductive coating 106 in FIG. 16. Thus, according to FIG. 16, an embedded core with high heat conductivity dielectric material is provided, forming part of the PCB carrier. The component 108 may be placed on the PCB core on the surface or inside of cavity or recess 104. Therefore, a part of the surface of the base structure 102 and a part of the surface of the component 108 are covered with thermally highly conductive coating 106 applied by laminating.

Referring to FIG. 17, a part of a still exposed surface of the base structure 102 and of the component 108 is covered with a further thermally highly conductive coating 106 applied by deposition. In other words, it is possible to print, deposit and/or dispense high heat conductivity dielectric material on the embedded core with assembled component 108. As can be taken from FIG. 17, the further thermally highly conductive coating 106 is applied to cover an exposed upper surface of the component 108 as well as of the exposed surface of the base structure 102. Thereby, substantially the entire circumferential surface of the component 108 is directly covered by (partially laminated and partially deposited) thermally highly conductive coating 106 extending up to the lateral exposed end of the structure shown in FIG. 17.

Referring to FIG. 18, the process of manufacturing the shown component carrier 100 is continued by laminating highly heat conducting material on the top of the package. More specifically, further electrically insulating layer structures 112 as well as one or more electrically conductive layer structures 110 may be applied to the upper main surface of the structure shown in FIG. 17. One of the additional layer structures is a further thermally highly conductive layer structure 120. The thermal performance of the component carrier 100 according to FIG. 18 is excellent, since a large portion of the base structure 102 and of the component 108 are directly covered with a continuous path of thermally conductive material. This allows to efficiently guide the heat from the component 108 to both opposing lateral surfaces of the base structure 102 of the component carrier 100. Furthermore, electric connections to the base structure 102 and component 108 may be finalized.

In the embodiment according to FIG. 16 to FIG. 18, embedded package or component carrier 100 is provided in which a high heat conductivity laminated material on one or two sides of component 108 is combined with a high heat conductivity of printed, deposited and/or dispensed material. The latter may be partially or fully formed on one side or two sides directly on the surface of the component 108 in a manner that the embedded PCB carrier is already fully or partially processed by the time of component placement on the PCB carrier.

The material to be used for the coating 106 can be any type of dielectric material with heat dissipation properties of preferably above 1 W/mK. The material can be any epoxy type of resin compound with fillers (such as alumina, conductive carbon fiber, etc.). Also graphene or DLC based materials can be used.

FIG. 19 to FIG. 22 illustrate cross-sectional views of structures obtained during carrying out a method of manufacturing a component carrier 100 with an embedded component 108 according to still another exemplary embodiment of the invention.

Figure 19:
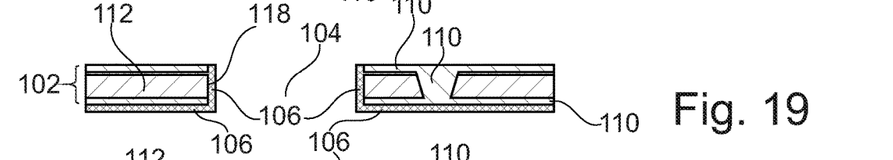
FIG. 19, FIG. 20, FIG. 21 and FIG. 22 illustrate cross-sectional views of structures obtained during carrying out a method of manufacturing a component carrier with an embedded component according to still another exemplary embodiment of the invention.

Referring to FIG. 19, a lower main surface as well as side walls 118 of the base structure 102 delimiting the recess 104 are covered with a layer of thermally highly conductive coating 106. Thereby, a preform of a PCB carrier is formed with a fully or partially printed, deposited and/or dispensed high heat conductivity layer. The dielectric material of the base structure 102 may or may not be a highly thermally conductive material (for instance may be made based on a highly thermally conductive layer structure 120). Therefore, a thermally highly conductive coating 106 is formed on the base structure 102 prior to assembling the temporary carrier 131 and the component 108 therewith.

Figure 20:
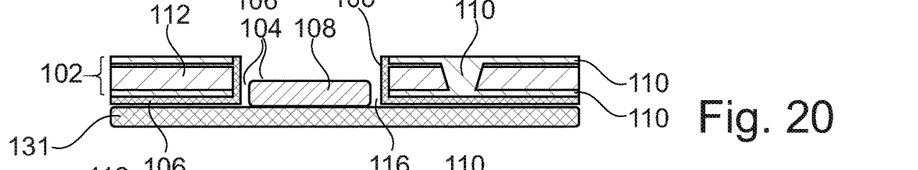

In order to obtain the structure shown in FIG. 20, the opening extending through the entire base structure 102 for forming the recess 104 in the base structure 102 is closed by attaching a sticky tape as temporary carrier 131 to the lower main surface of the structure of FIG. 19. Thereafter, the component 108 is mounted in the so formed blind hole so that only a tiny gap 116 (for instance having a lateral width of not more than 50 µm) remains between the thermally highly conductive coating 106 on the side wall 118 and the component 108.

In case of using a temporary carrier 131, the coated base structure 102 is placed on the temporary carrier 131, and the component 108 is placed on the temporary carrier 131 in the recess 104 of the package under manufacture. The base structure 102 may alternatively also be embodied as a PCB carrier with blind hole so that the temporary carrier 131 is optional.

Figure 21:
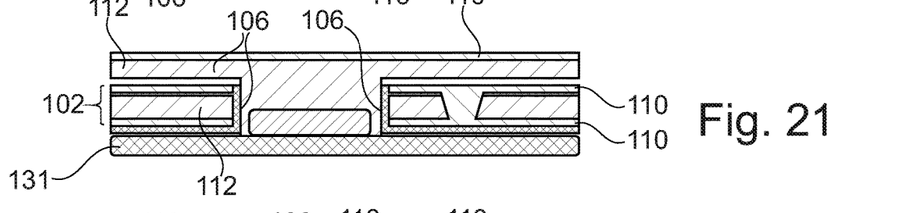

In order to obtain the structure shown in FIG. 21, a further electrically insulating layer structure 112 and a further electrically conductive layer structure 110 are connected to an upper main surface of the structure shown in FIG. 20 by lamination. It is more generally possible to laminate, print, deposit and/or dispense the next dielectric build up layer that may or may not be a high heat conductivity material. It is possible that the further electrically insulating layer structure 112 is also made of a highly thermally conductive material and may then form part of the coating 106. Thereafter, the temporary carrier 131 may be removed.

Figure 22:
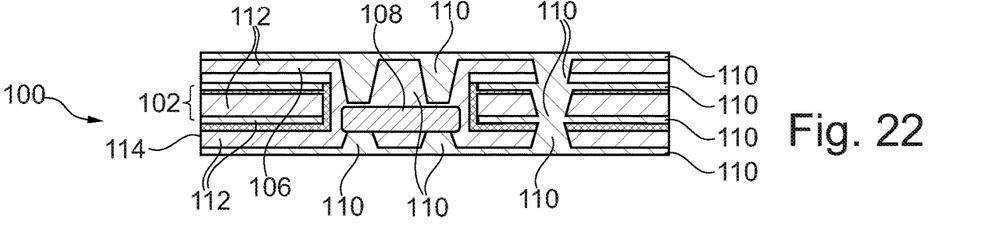

As shown in FIG. 22, further electrically insulating layer structures 112 and electrically conductive layer structures 110 may be connected with the lower main surface of the structure shown in FIG. 21 after removal of the temporary carrier 131. Additionally, access holes may be drilled and filled with electrically conductive material to complete formation of the component carrier 100 shown in FIG. 22. Hence, it is possible to finalize the embedded core package or component carrier 100 by laminating a further dielectric layer on the bottom side of the package that may or may not be a high heat conductivity material and form the electrical connections to the base structure 102 and component 108. In the embodiment of FIG. 19 to FIG. 22, an embedded package is provided in which a high heat conductivity material is printed, deposited and/or dispensed partially on the PCB carrier prior to the component placement. In the embodiment of FIG. 22, it is for instance possible that the entire dielectric layer structures of the component carrier 100 are made of highly thermally conductive material for excellent heat removal performance.

FIG. 23 to FIG. 26 illustrate cross-sectional views of structures obtained during carrying out a method of manufacturing a component carrier 100 with an embedded component 108 according to still another exemplary embodiment of the invention.

Figure 23:
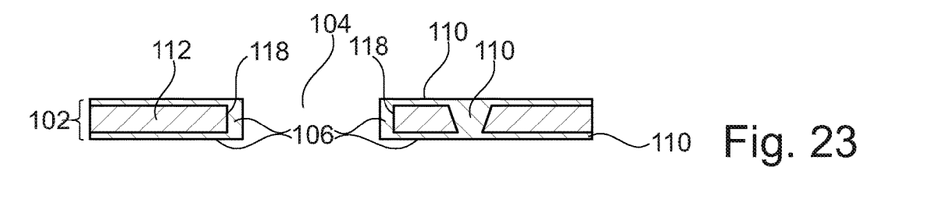
FIG. 23, FIG. 24, FIG. 25 and FIG. 26 illustrate cross-sectional views of structures obtained during carrying out a method of manufacturing a component carrier with an embedded component according to still another exemplary embodiment of the invention.

Referring to FIG. 23, a preform of a PCB carrier or component carrier 100 is formed with cavity walls (see vertical side walls 118) of a base structure 102 that are plated with electrically conductive and thermally conductive material such as copper or aluminum to improve and enhance the heat conductivity. The dielectric material of the base structure 102 may or may not be of high heat conductivity.

Figure 24:
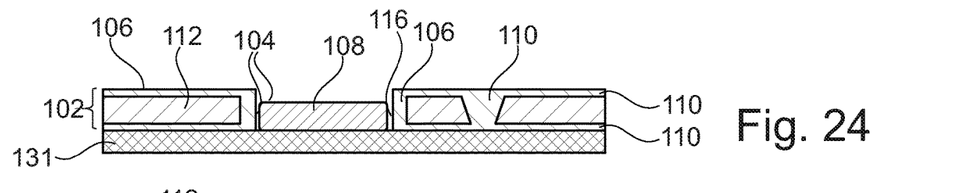

Referring to FIG. 24, the base structure 102 treated according to FIG. 23 is placed on temporary carrier 131. Subsequently, the component 108 is mounted on the package. The base structure 102 may also be produced in a manner that temporary carrier 131 is not required, for instance as shown in FIG. 9 to FIG. 11.

Figure 25:
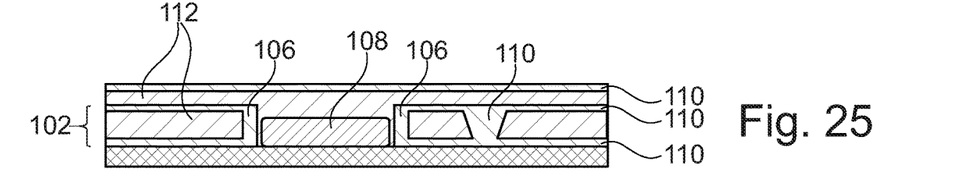

Referring to FIG. 25, it is then possible to laminate, print, deposit and/or dispense the next build up layer(s) that may or may not be made of a high heat conductivity material. After stiffening the structure (in particular by lamination), the temporary carrier 131 may be removed.

Figure 26:
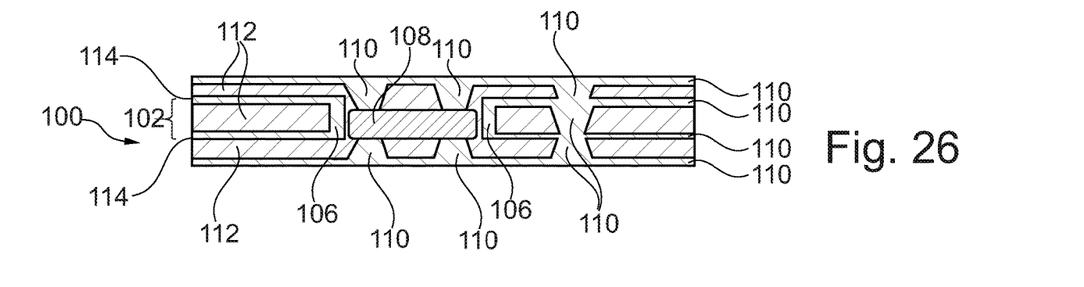

Referring to FIG. 26, the embedded core package or component carrier 100 may be finalized by laminating a further dielectric layer on the bottom side of the package that may or may not be made of a high heat conductivity material. Electrical connections to the base structure 102 and the component 108 may be formed.

The embodiment shown in FIG. 23 to FIG. 26 differs from the embodiment described referring to FIG. 19 to FIG. 22 substantially in that copper material is deposited on the side walls 118 of the base structure 102 to form the thermally highly conductive coating 106 thereof. The corresponding embodiment therefore relates to an embedded package or component carrier 100, in which a heat dissipation is enhanced by forming metal plated walls inside of the cavity or recess 104.

FIG. 27 to FIG. 30 illustrate exploded views of component carriers 100 with an embedded component 108 according to exemplary embodiments of the invention.

Figure 27:
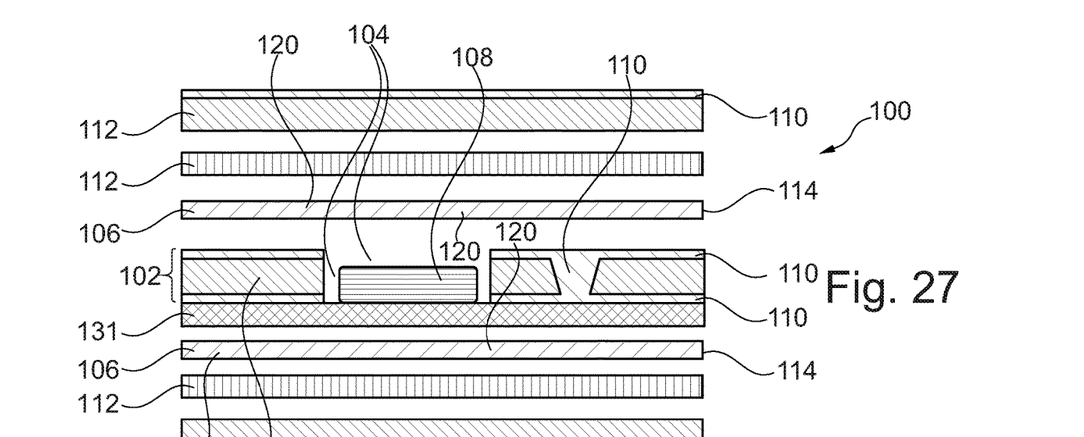
FIG. 27, FIG. 28, FIG. 29 and FIG. 30 illustrate exploded views of component carriers with an embedded component according to exemplary embodiments of the invention.

The embodiment shown in FIG. 27 corresponds to a configuration in which the highly thermally conductive coating 106 is formed by two highly thermally conductive layer structures 120 attached to both opposing main surfaces of the base structure 102 and the component 108.

Figure 28:
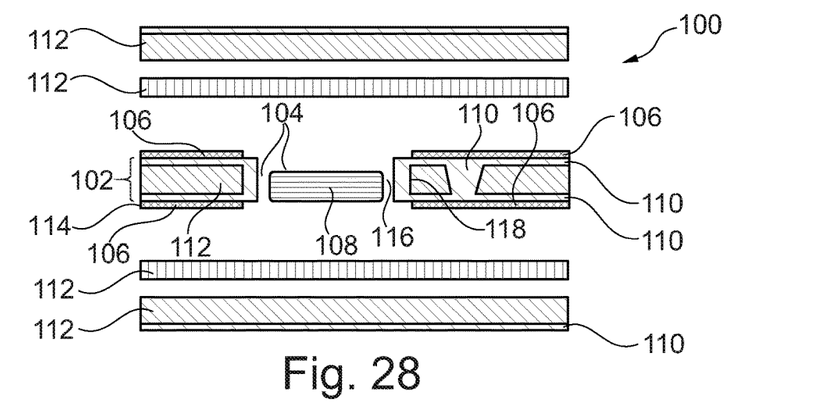

The embodiment of FIG. 28 relates to a configuration in which the thermally highly conductive coating 106 is formed by a combination of corresponding dielectric layer sections on opposing main surfaces of the base structure 102 in combination with a copper coating of the side walls 118 of the base structure 102.

Figure 29:
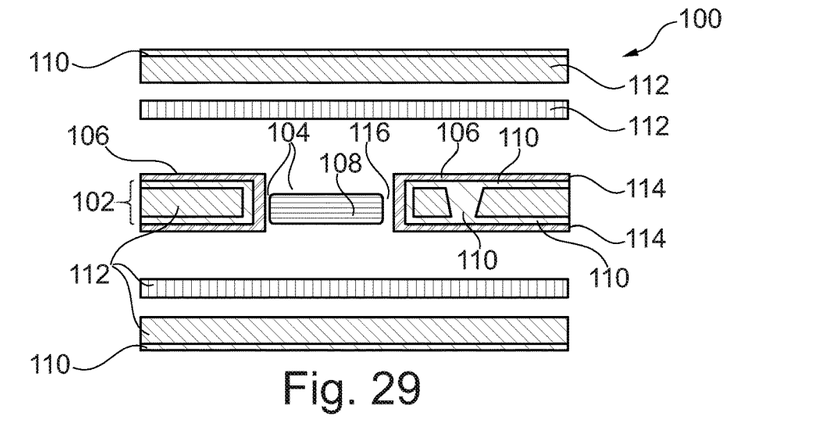

The embodiment of FIG. 29 differs from the embodiment of FIG. 28 in that the highly thermally conductive coating 106 is composed of one material only which however extends along top and bottom walls as well as side walls 118 in a similar way as in FIG. 28.

Figure 30:
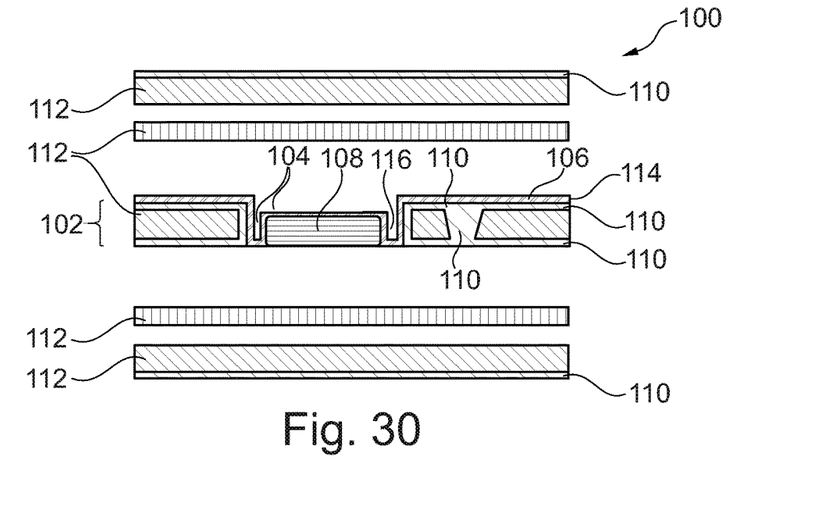

FIG. 30 shows a highly thermally conductive coating 106 applied not only on the base structure 102 but also on the component 108 and being embodied as a continuous curved layer extending from a lateral exposed surface of the component carrier 100 up to the position of the embedded component 108.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:
1. A component carrier, comprising:
a base structure having a recess;

a thermally highly conductive coating covering at least a part of a surface of the base structure; and a component in the recess, wherein the thermally highly conductive coating directly covers at least a part of a first surface of the component, wherein the thermally highly conductive coating further directly covers at least a part of a side surface of the component;

wherein the thermally highly conductive coating forms a conformal and curved deposition layer;

wherein the conformal and curved deposition layer has an indentation over the recess.

2. The component carrier according to claim 1, wherein the thermally highly conductive coating has a value of thermal conductivity of at least 50 W/mK in a direction perpendicular to a main surface of the component carrier.

3. The component carrier according to claim 1, wherein the thermally highly conductive coating has a value of thermal conductivity of at least 1 W/mK in a direction perpendicular to a main surface of the component carrier.

4. The component carrier according to claim 1, wherein the thermally highly conductive coating comprises at least one material of the group consisting of diamond-like carbon, graphene, highly thermally conductive prepreg, a resin filled with thermally highly conductive filler particles, copper, and aluminum.

5. The component carrier according to claim 1, wherein the thermally highly conductive coating extends continuously from the recess up to an exterior surface of the component carrier.

6. The component carrier according to claim 1, wherein the thermally highly conductive coating is a three-dimensionally curved continuous layer.

7. The component carrier according to claim 1, wherein the thermally highly conductive coating is a layer with a substantially uniform thickness.

8. The component carrier according to claim 1, wherein the thermally highly conductive coating covers at least a part of a gap in the recess between the base structure and the component.

9. The component carrier according to claim 1, wherein the thermally highly conductive coating covers at least one of at least part of both opposing main surfaces of the base structure, and at least part of both opposing main surfaces of the component.

10. The component carrier according to claim 1, wherein at least part of the thermally highly conductive coating covers a side wall of the recess of the base structure.

11. The component carrier according to claim 1, comprising at least one of the following features:

wherein dielectric material of the base structure has a value of thermal conductivity smaller than that of the highly thermally conductive coating;

wherein dielectric material of the base structure has a value of thermal conductivity of less than 1 W/mK in a direction perpendicular to a main surface of the component carrier;

wherein the base structure comprises one of the group consisting of a core, and a stack comprising at least one electrically conductive layer structure and/or the at least one electrically insulating layer structure;

wherein the component is thermally coupled to the thermally highly conductive coating;

comprising at least one electrically insulating layer structure and/or at least one electrically conductive layer structure connected on at least one of the base structure and the component;

wherein at least one of electrically conductive material of the base structure, and the at least one electrically conductive layer structure comprises at least one of the group consisting of copper, aluminum, nickel, silver, gold, palladium, and tungsten, any of the mentioned materials being optionally coated with supra-conductive material such as graphene;

wherein at least one of dielectric material of the base structure, and the at least one electrically insulating layer structure comprises at least one of the group consisting of resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an opto-electronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guide, a further component carrier and a logic chip;

shaped as a plate;

wherein the component carrier is configured as one of the group consisting of a printed circuit board, and a substrate.

12. A method of manufacturing a component carrier, comprising:

providing a base structure having a recess;

covering by laminating and/or deposition of thermally conductive material at least a part of a surface of the base structure with a thermally highly conductive coating;

mounting a component in the recess; and directly covering by laminating and/or deposition of thermally conductive material at least a part of a first surface and a side surface of the component with the thermally highly conductive coating, wherein a first part of the surface of the base structure is covered with the thermally highly conductive coating applied by laminating, and a second part of the surface of the base structure is covered with the thermally highly conductive coating applied by deposition.

13. The method according to claim 12, wherein the surface of the base structure is covered with the thermally highly conductive coating by at least one of the group consisting of dispensing, ink jetting, screen printing, stencil printing, laminating, printing, chemical vapor deposition, and physical vapor deposition.

14. The method according to claim 12, wherein the surface of the base structure is covered with the thermally highly conductive coating by laminating a thermally highly conductive layer structure on the base structure and the component.

15. The method according to claim 12, wherein a first main surface of the base structure is covered with the thermally highly conductive coating by laminating a first thermally highly conductive layer structure on the first main surface, and a second main surface of the base structure is covered with the thermally highly conductive coating by simultaneously laminating a second thermally highly conductive layer structure on the second main surface.

16. The method according to claim 12, wherein the surface of the base structure is covered with the thermally highly conductive coating by depositing a conformal layer of the thermally highly conductive material.

17. The method according to claim 16, wherein the layer of thermally highly conductive material is a planar layer deposited on a main surface of the base structure and on a main surface of the component being in flush with one another.

18. The method according to claim 12, wherein at least one of the entire surface of the base structure and the entire surface of the component is covered with the thermally highly conductive coating.

19. A method of manufacturing a component carrier, comprising:
- providing a base structure having a recess;
- covering at least a part of a surface of the base structure with a thermally highly conductive coating;
- mounting a component in the recess; and
- directly covering at least a part of a first surface and a side surface of the component with a thermally highly conductive coating;
- wherein the surface of the base structure is covered with the thermally highly conductive coating by depositing a conformal layer of thermally highly conductive material and wherein the layer of thermally highly conductive material is a curved layer deposited on a main surface of the base structure and on a main surface of the component, the layer of thermally highly conductive material having an indentation over the recess.

* * * * *